United States Patent
Ng et al.

(10) Patent No.: US 6,191,012 B1
(45) Date of Patent: Feb. 20, 2001

(54) METHOD FOR FORMING A SHALLOW JUNCTION IN A SEMICONDUCTOR DEVICE USING ANTIMONY DIMER

(75) Inventors: Che-Hoo Ng, San Martin; Matthew S. Buynoski, Palo Alto, both of CA (US)

(73) Assignee: Advanced Micro Devices, Sunnyvale, CA (US)

(*) Notice: Under 35 U.S.C. 154(b), the term of this patent shall be extended for 0 days.

(21) Appl. No.: 09/205,522

(22) Filed: Dec. 3, 1998

(51) Int. Cl.[7] ......................................... H01L 21/04
(52) U.S. Cl. ....................... 438/510; 438/302; 438/303
(58) Field of Search ................................... 438/303, 322, 438/202, 230, 305, 510, 511, 302

(56) References Cited

U.S. PATENT DOCUMENTS

| | | | | |
|---|---|---|---|---|
| 5,893,743 | * | 4/1999 | Gomi et al. | 438/322 |
| 6,008,098 | * | 12/1999 | Pramanick et al. | 438/305 |
| 6,022,771 | * | 2/2000 | Ma et al. | 438/230 |
| 6,025,242 | * | 2/2000 | Ma et al. | 438/303 |

* cited by examiner

*Primary Examiner*—David Nelms
*Assistant Examiner*—Dung A Le
(74) *Attorney, Agent, or Firm*—Brinks Hofer Gilson & Lione

(57) ABSTRACT

A method for forming a shallow junction in a semiconductor device includes the steps of ion implanting a molecular antimony dimer ($Sb_2+$) into a semiconductor substrate. The antimony dimer implantation process creates a shallow doped junction having a high dopant concentration and a shallow junction depth. The antimony dimer ion is extracted from an antimony source material at an extremely low extraction voltage. The use of a low extraction voltage enables the antimony dimer ion to be analyzed by an analyzer magnetic within the ion implantation device. The process of the invention can be used to form a variety of shallow dope structures in semiconductor devices, such as source/drain extension regions, implanted resistors, and the like.

20 Claims, 3 Drawing Sheets

METHOD FOR FORMING A SHALLOW JUNCTION IN A SEMICONDUCTOR DEVICE USING ANTIMONY DIMER

BACKGROUND OF THE INVENTION

1. Field of Invention

This invention relates generally, to a method for forming a doped region in a semiconductor device, and more particularly, to a method for forming a shallow doped junction using ion implantation.

2. Description of the Prior Art

As the demand for high performance semiconductor devices increases, device manufacturers continually redesign semiconductor devices, such as integrated circuits, to have smaller and smaller dimensions. Of the many different device components used in an integrated circuit, the dimension of the gate electrode in a metal-oxide semiconductor (MOS) device is the benchmark dimension by which all other device components are measured. Typically, state of the art MOS devices have gate dimensions in the range of about 0.1 to 0.25 microns.

As gate dimensions are scaled to smaller and smaller values, a concomitant requirement for a reduction in the junction depth of transistor components such as source and drain regions, exists. In addition to requiring a small junction depth, state of the art MOS transistors also require extremely high surface doping concentrations in the source and drain regions. Typically, many doped regions are formed in a semiconductor substrate in the vicinity of the substrate surface. Dopant atoms of either n-type or p-type are typically incorporated into the silicon substrate using both thermal diffusion and ion implantation.

Ion implantation is a physical process in which dopant atoms are ionized, accelerated to a velocity high enough to penetrate the surface of a silicon substrate, focused into a narrow ion beam, and scanned as a beam across the surface of a semiconductor substrate. Dopant ions impacting the surface of the substrate enter the substrate and come to rest below the substrate surface. The depth of penetration into the semiconductor substrate depends upon the particular species and the ion implantation energy. Ion implantation is used in most doping operations in the fabrication of submicron dimension integrated circuit devices. State of the art ion implantation processes can be carried out to form doped regions of precise doping concentration and implantation depth. Doping by means of thermal diffusion is a chemical process typically used to dope thin film layers that do not require the formation of well-defined doped regions.

Typically, source and drain regions in MOS transistors are formed by ion implantation techniques, and in the case of an n-type transistor, dopants such as phosphorus, arsenic, and antimony are commonly used. Modem ion implantation systems analyze an ion beam that has been extracted from an ion source. The extraction efficiency varies depending upon the particular source material and the particular dopant species to be implanted. For common n-type dopants the maximum beam currents are obtained from singly charged individual ions.

To operate an ion implantation system efficiently, and at low cost, a maximum beam current is necessary to maintain a high throughput. Accordingly, the formation of n-type source and drain regions is most commonly carried out using singly-charged, single n-type ions. Since the ion implantation depth, for a given species, varies directly with the ion implantation energy, a very low implantation energy must be used to form a shallow junction in the substrate. The ion implantation system must be operated at very low voltages to obtain the low implantation energy necessary to form a shallow doped region. However, both ion beam extraction efficiency and dose measurement can be adversely affected at low voltage operation. Additionally, at low voltages, beam stability is reduced and spot size control becomes more difficult. Accordingly, a need existed for a method of forming a shallow, highly-doped region in a semiconductor substrate, while maintaining optimal ion implantation operating conditions.

SUMMARY OF THE INVENTION

In practicing the invention there is provided a method for forming a shallow junction in a semiconductor device, which in one embodiment, includes the implantation of an antimony dimer into a silicon substrate. A shallow doped region having a dopant concentration of about 1.0E17 to at least the solid solubility of antimony in silicon (1.0E20 atoms/cm$^3$) is obtained with a junction depth ranging from about 5 to 80 nanometers. The inventive process enables high efficiency operation of an ion implantation system, while improving the overall throughput of the ion implantation system. By creating shallow doped junctions with an antimony dimer, the effective energy of the implantation is one-half of that for a single antimony ion. Because the effective implantation energy is one-half that of the single ionic species, the ion implantation system can be operated at relatively high energy levels. Additionally, the implantation of antimony dimer imparts two antimony atoms for each implanted ion. As a result, the dose necessary to produce a highly-doped region can be obtained at twice the rate realized from a single antimony ion.

The inventive process includes the steps of providing a substrate having a predefined implant region; providing an ion beam of substantially pure antimony dimer; and implanting the antimony dimer into the predefined implant region. The foregoing process can be advantageously employed to form a variety of device structures and integrated circuit device, such as source drain extension regions, implanted resistors, bipolar emitter regions, and the like.

Figure 1:
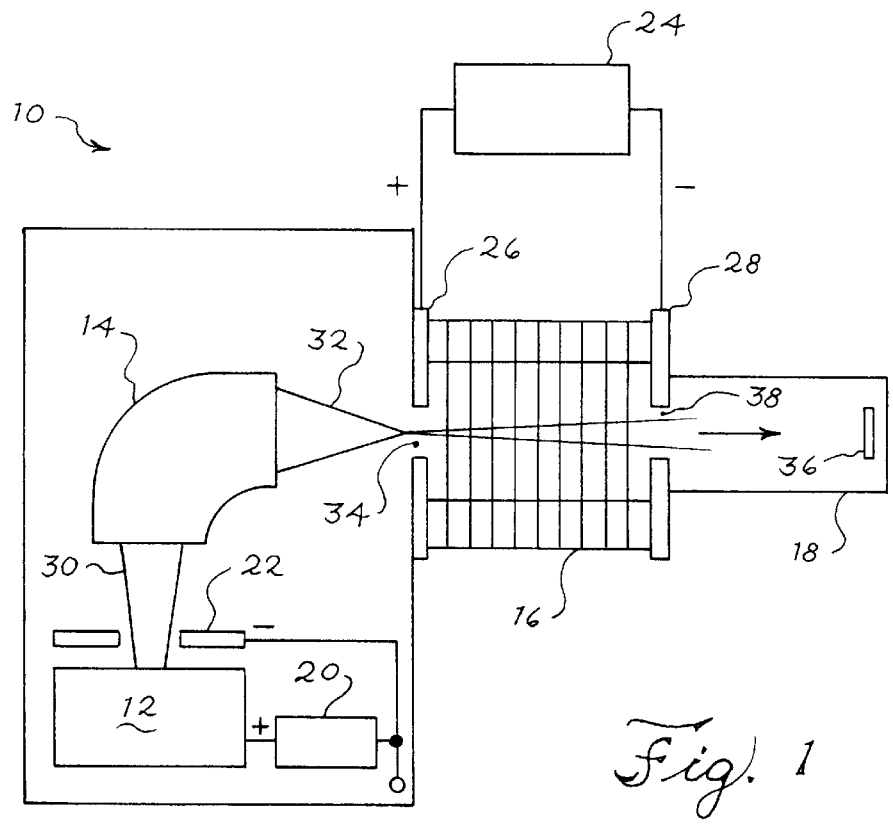
FIG. 1 is a top plan view of an ion implantation device useful for practicing the invention.

It will be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate corresponding elements.

DETAILED DESCRIPTION OF THE PREFERRED EMBODIMENTS

FIG. 1 illustrates a top plain view of an ion implantation system useful for practicing the present invention. Ion implantation system 10 includes a source chamber 12, an analyzer magnet 14, and acceleration to 16, and an end station 18. An extraction power supply 20 is electrically coupled to an extraction electrode 22, and to an ion source (not shown) contained within source chamber 12. An acceleration power supply 24 is electrically coupled to acceleration electrodes 26 and 28 at opposite ends, respectively, of acceleration tube 16.

In operation, extraction electrode 22 extracts an incident ion beam 30 from source chamber 12. Incident ion beam 30 is analyzed by analyzer magnet 14, where a desired ion species is selected from ion beam 30. Analyzing magnet 14 emits analyzed ion beam 32, and directs the beam toward an aperture 34 located in electrode 26. Analyzer magnet 14 filters all but a single, desired species from incident ion beam 30 to form analyzed ion beam 32. A magnetic field created within analyzer magnet 14 causes each ion in ion beam 30 to follow an arching trajectory, while traveling through analyzer magnet 14. The radius of the trajectory of a given ion depends upon the mass and velocity of the ion, along with the strength of the magnetic field within analyzing magnet 14. A mechanical abstraction within analyzing magnet 14 blocks all ions with trajectories that do not have the proper curvature to pass through the exit end of analyzing magnet 14. Thus, only the desired dopant ions exit analyzing magnet 14 to form analyzed ion beam 32.

Upon entering aperture 34, analyzed ion beam 32 is accelerated by acceleration tube 16 and directed toward end station 18. Those skilled in the art will recognize that commercial ion implantation systems typically include additional focusing systems to properly focus the beam after the beam exits acceleration tube 16. Additionally, those skilled in the art will appreciate that many different types of end station configurations are possible, depending upon the particular beam current capability of the ion implantation system.

An ion source within source chamber 12 ionizes a feed gas containing atoms of a dopant element. Common dopant elements include boron, phosphorus, antimony and arsenic. Positively charged dopant ions are formed within ion source chamber 12 through collisions between dopant feed gas molecules and energetic electrons from an arc discharge within the ion source. The dopant ions are accelerated by electric field repulsion from source chamber 12, which is maintained at a positive potential, and electrical attraction toward extraction electrode 22, which is maintained at a negative potential relative to source chamber 12.

Although initially accelerated by extraction electrode 22, dopant ions can be further accelerated by acceleration tube 16 to a specified energy level depending upon the desired implantation depth, and the particular ionic species in analyzed ion beam 32. Typical extraction voltages range from about 5 to about 80 kilo electron volts (KeV). Most acceleration tubes, such as acceleration tube 16, are capable of accelerating an ion beam to produce ion energies ranging from the extraction energy to about 180 KeV.

To perform an ion implantation procedure, a substrate, such as a silicon substrate 36, is placed within end station 18 in alignment with analyzed ion beam 32. Prior to actual ion implantation, end station 18 is evacuated to remove ambient gases from the vicinity of silicon substrate 36. During ion implantation, analyzed ion beam 30 exits through an aperture 38 in electrode 28. Aperture 38 allows gaseous communication between end station 18 and acceleration tube 16.

Once end station 18 is evacuated to the desired vacuum level, aperture 38 is open and ion implantation begins. For a singly charged ionic species, the particular level of ion beam current generated by ion implantation system 10 is directly proportional to the extraction voltage maintained by extraction power supply 20. Those skilled in the art will appreciate that the efficiency of extraction electrode 22 at drawing ion beam 30 out of source chamber 12 depends on a number of factors, such as the particular ionic species being generated, the source material (e.g., solid, liquid, gas), the efficiency of the ion source, and the like. However, for a given ionic species and source material, the ion beam current will vary proportionally with the extraction voltage.

Figure 2:
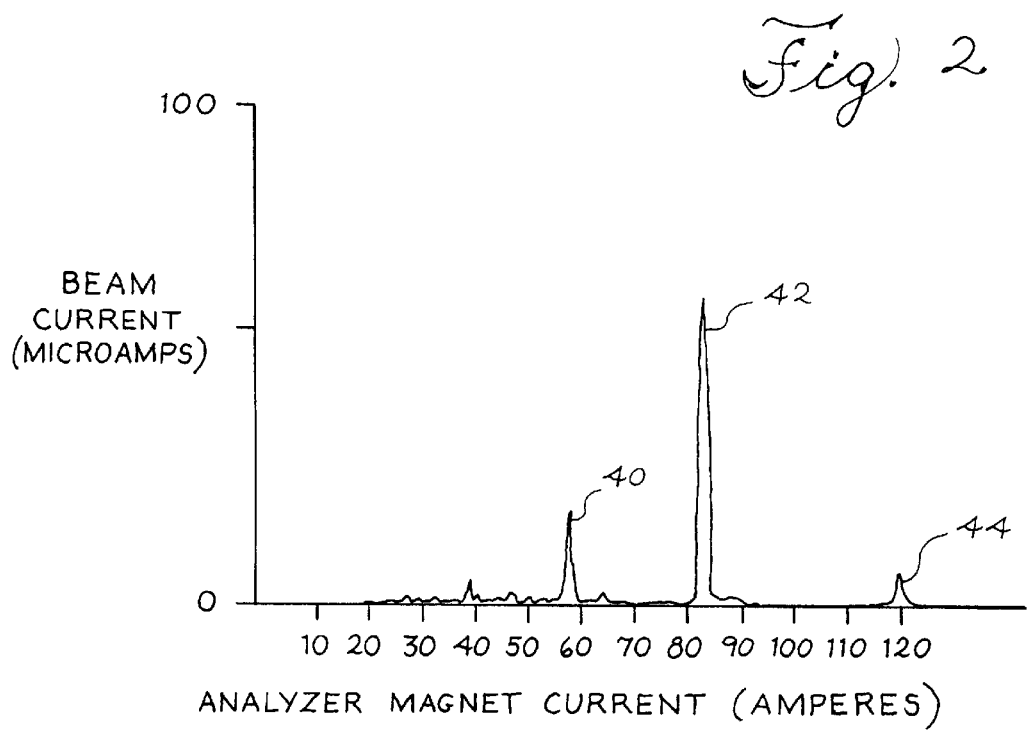
FIG. 2 is a plot of beam current versus analyzer magnet current illustrating the resolution of antimony isotopes in accordance with the invention.

FIG. 2 illustrates a plot of antimony beam current versus analyzer magnet current. To generate the plot illustrated in FIG. 2, antimony trioxide ($Sb_2O_3$) was placed in source chamber 12 and the beam current was monitored as the analyzer current was ramped up in analyzer magnet 14. The resulting plot shows the major ionic species obtained from the antimony trioxide source material. The first major ionic species 40 appears at an analyzer magnet current of about 58 amps. The second major ionic species 42 appears at an analyzer magnet current of about 83 amps. The third major ionic species 44 appears at an analyzer magnet current of about 119 amps.

The analyzer magnet current necessary to obtain separate analyzed signals of the various ionic species extracted from the antimony source can be correlated with the atomic mass of each species. In the plot of FIG. 2, an antimony ionic dimer ($Sb_2^+$) corresponds to ionic species 44 and has an equivalent atomic mass of about 242. The major species in the spectrum illustrated as ionic species 42 is a single antimony ion ($Sb^+$) and corresponds to an atomic mass unit (AMU) of about 121. The first ionic species 40 is doubly-charged antimony and also corresponds to an equivalent AMU of about 121. Those skilled in the art will recognize that elemental antimony has two isotopes of AMU 121 (57.3%) and AMU 123 (42.7%), and that the ionic species 42 includes both antimony isotopes of AMU 121 and AMU 123. In addition, depending upon the mass resolution capability of the particular ion implantation apparatus, both isotopes can appear as one peak in analyzed spectrum.

In accordance with the invention, the full spectrum generated from a solid antimony source is most distinctly obtained by operating the extraction voltage at relatively low values. For example, to obtain an analyzed spectrum of the antimony dimer ($Sb_2^+$), the extraction voltage must be maintained at preferably about 5 kilovolts (KV) or lower. This is because at higher extraction voltages, many ion implantaters do not have sufficient analyzer magnet resolution power to resolve ionic species of large mass. At AMU 242, antimony dimer is much heavier than common n-type dopants, such as arsenic (AMU 75), and the like. However, in accordance with the invention, resolution of antimony dimer is obtained by operating the ion implanter at a low extraction voltage of about 1 to 30 keV. Thus, the inability to generate a very large magnetic field in the analyzer magnet is compensated by operation with low extraction energy. As will subsequently be described, the ability to analyze and resolve the antimony dimer from an antimony ion beam can advantageously be used to create extremely shallow, highly-doped junctions in a semiconductor substrate.

Figure 3:
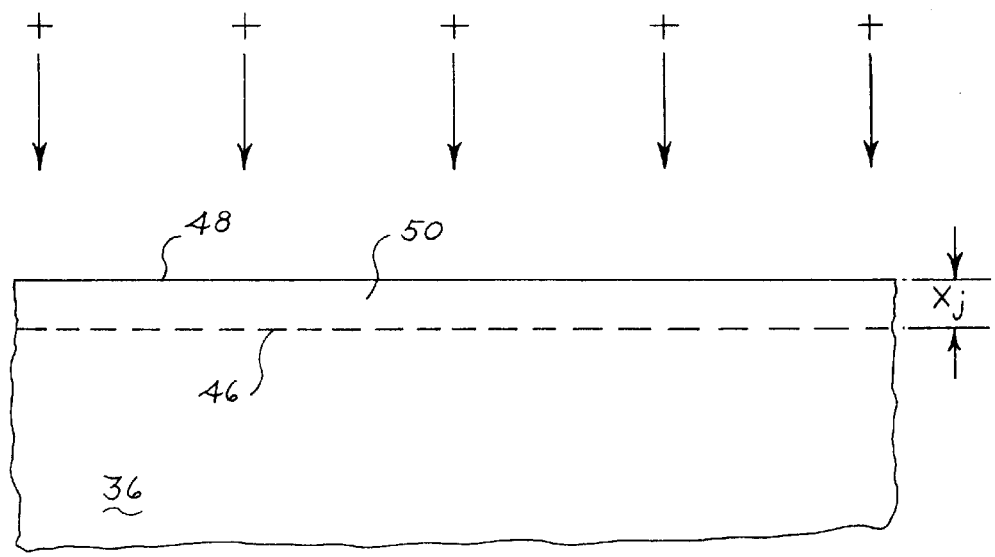
FIG. 3 illustrates, and cross-section, a portion of a silicon substrate having a shallow doped region formed in accordance with the invention.

Shown in FIG. 3, in cross-section, is a portion of silicon substrate 36. Upon the implantation of antimony dimer by ion implantation system 10, a junction 46 is formed in silicon substrate 36 at some junction depth ($X_j$) from a surface 48. Those skilled in the art will appreciate that the value of $X_j$ depends on a number of factors, including the particular crystalline orientation of the silicon in silicon substrate 36, the presence of a surface oxide or other material overlying surface 48, the implant energy, the temperature of silicon substrate 36, and the like. In a preferred embodiment of the invention, an ion implantation process is carried out to implant ionized antimony dimer into a silicon substrate to a junction depth of preferably about 5 to 80 nanometers.

Upon completion of the antimony dimer implant, a highly-doped region 50 is formed at the surface of silicon substrate 36. The surface doping concentration can be expressed according to the following equation:

$$\Phi = 2(Q/mqA) \quad (I)$$

where $\Phi$ is the arial dose in atom/cm$_2$, Q is the integrated charge in coulombes, m is the charge state of the ion, q is the electron charge, and A is the area swept by the ion beam in square centimeters. The factor 2 is a result of implantation of antimony dimer, and effectively doubles the dopant concentration in silicon substrate 36. A particular advantage of the present invention includes the ability to form a highly-doped region at an extremely shallow junction depth. The 2X increase in dopant concentration obtained by the process of the present invention advantageously forms a highly-doped region in a short implant duration. This is because for a given beam current, each dimer ion delivered to the substrate consists of two antimony atoms. By reducing the implant time necessary to form a region of given dopant concentration, the productivity of ion implantation system 10 is increased. During operation of ion implantation system 10, the dose control system can be adjusted to accumulate approximately one-half of the dose necessary to form the same dopant concentration with a singly charged ion species. The ability to accumulate the necessary dose in approximately half the implant time directly translates into an increase in throughput for the formation of highly-doped regions in a silicon substrate, such as highly-doped region 50 in silicon substrate 36.

Those skilled in the art will appreciate that the process of the present invention can be used to form many different types of device structures in semiconductor devices. For example, implanted resistors can be formed by means of the present invention for use in both bipolar and MOS devices. Additionally, other structures can be formed, such as emitter regions in bipolar devices, and source/drain extension regions in MOS device. Accordingly, it is within the scope of the present invention to form all such structures and device components in various bipolar and MOS semiconductor devices.

Figure 4:
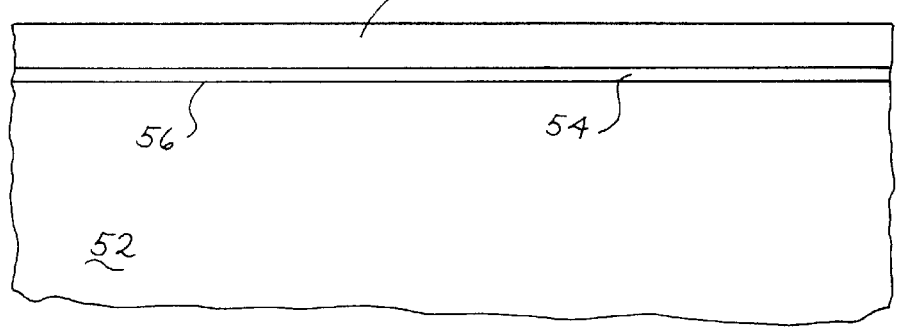
FIGS. 4–7 illustrate, and cross-section, processing steps in accordance with one embodiment of the invention.

FIGS. 4–7 illustrate, in cross-section, various processing steps in accordance with one embodiment of the invention. Shown in FIG. 4 is a portion of a semiconductor substrate 52 having already undergone several steps in accordance with the invention. A thin oxide layer 54 overlies a surface 56 of semiconductor substrate 52, and a polycrystalline silicon layer 58 overlies oxide layer 54. Oxide layer 54 is preferably formed by a dry, thermal oxidation process to form a thin gate oxide having a thickness of about 2 to 20 nanometers. Polycrystalline silicon layer 58 is preferably formed by chemical vapor deposition to a thickness of about 50 to 250 nanometers. Polycrystalline silicon layer 58 is doped with an n-type dopant to a desired conductivity. Those skilled in the art will appreciate that the conductivity of polycrystalline silicon layer 58 will vary depending upon the particular device component that is to be formed from polycrystalline silicon layer 58. In the present embodiment, polycrystalline silicon layer 58 is doped to a conductivity of about 150 ohms per square for the formation of an MOS gate electrode.

Figure 5:
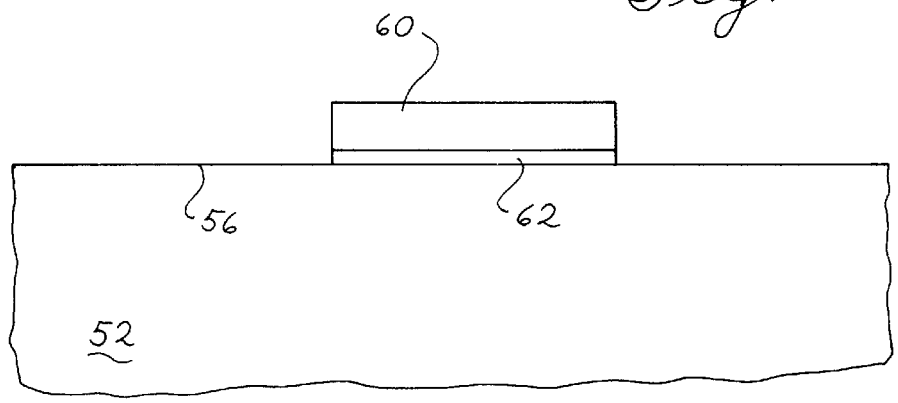

After depositing polycrystalline silicon layer 58, photolithographic and etching processes are carried out to form a gate electrode 60 overlying a gate oxide layer 62, as illustrated in FIG. 5. To form gate electrode 60 and gate oxide layer 62 various processes known in the art can be used depending upon the final desired gate electrode dimensions. For example, state of the art MOS transistors can have gate electrode lengths varying from 0.50 microns to about 0.25 microns.

Figure 6:
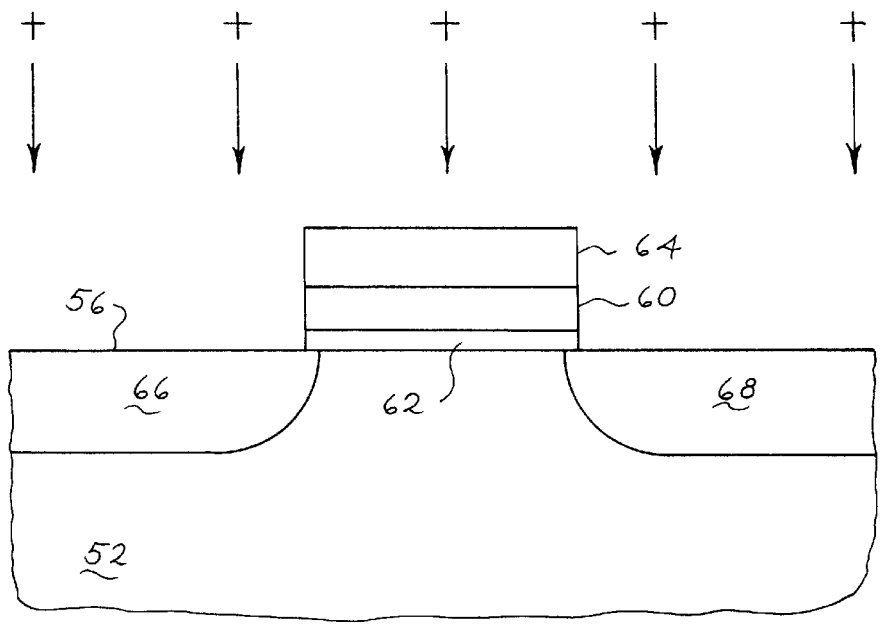

After forming gate electrode 60, a photoresist layer 64 is defined on semiconductor substrate 52 to protect gate electrode 60, as shown in FIG. 6. Once photoresist layer 64 is in place, an ion implanstation process is carried out to form a source region 66 and a drain region 68 in semiconductor substrate 52. By precisely defining photoresist layer 64, source region 66 and drain region 68 are aligned to gate electrode 66 and reside in semiconductor substrate 52 adjacent to the edges of gate electrode 60. Preferably, source region 66 and drain region 68 are formed by implanting phosphorus or arsenic ions into semiconductor substrate 52 to a junction depth of about 10 to 150 nanometers.

Figure 7:
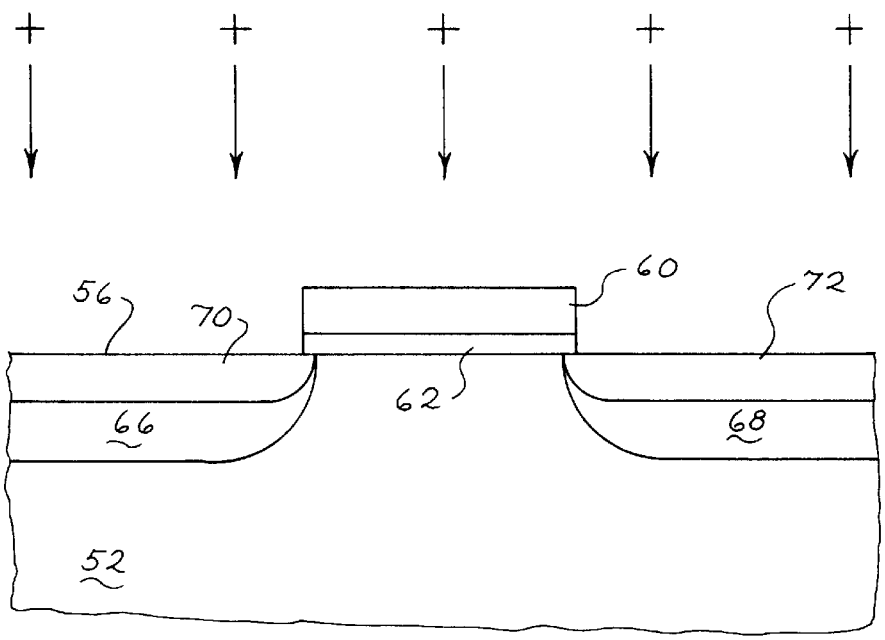

After forming the source and drain regions, source/drain extension regions 70 and 72 are formed in semiconductor substrate 52, as illustrated in FIG. 7. The source drain extension regions 70 and 72 are formed using the previously described antimony dimer ion implantation process. To form source/drain extension regions 70 and 72 the antimony dimer implantation process is preferably carried out to impart, a dose of about 1.0 E13 to 1.0 E15 ions/cm$_2$, and more preferably to obtain a dose of about 1.0 E14 to 5.0 E14 ion/cm$_2$. The antimony dimer is implanted at a preferred energy of about 1.0 to 30 keV, and more preferably, at an energy of about 5 keV.

Once the antimony dimer implantation process is complete, semiconductor substrate 52 is annealed to activate the implanted dopant atoms. Preferably, the annealing process is carried out using a rapid thermal annealing apparatus at a temperature of about 950 to 1300° C. and for a time of about 1 to 20 seconds. Alternatively, a laser annealing apparatus can be used with an annealing time of about 1 to 100 nanoseconds. In order to reduce the loss of antimony from substrate 52 by sublimation during rapid thermal annealing, the annealing process is carried out in an inert atmosphere. Preferably, a positive pressure of nitrogen is maintained in the annealing apparatus at all times while substrate 52 is subjected to high temperature conditions. In addition to avoiding the loss of antimony from substrate 52, the maintenance of an ambient atmosphere prevents formation of oxides at surface 56 of semiconductor substrate 52.

In accordance with methods known in the art, semiconductor substrate 52 is further processed to form the various device components necessary to fabricate an integrated circuit. For example, isolation layers and multiple layers of metal interconnects are formed to electrically connect the various device components. The various processing steps necessary to form insulation layers and metal interconnects, and the like, are substantially similar to the deposition and etching steps previously described.

Thus, it is apparent that there has been provided, in accordance with the invention, a method for forming a shallow junction in a semiconductor device that fully meets the advantages set forth above. Although the invention has been described and illustrated with reference to specific embodiments thereof, it is not intended that the invention be limited to those illustrated embodiments. Those skilled in the art will recognize the variations and modifications can be made without departing from the spirit of the invention. For example, different semiconductor substrates can be used, such as silicon-on-insulation (SOI), epitaxial silicon on single crystal silicon, and the alike. It is therefore intended to include within the invention all such variations and modifications has fall within the scope of the appended claims and equivalents thereof.

We claim:

1. A method performing a shallow junction in a semiconductor device comprising the steps of:
   providing a substrate having a predefined implant region therein;
   providing an ion beam of substantially pure antimony dimer; and
   implanting the antimony dimer into the predefined implant region.

2. The method of claim 1, wherein the step of providing substantially pure antimony dimer comprises the steps of:
   extracting the ion beam from an ion source at an extraction energy of about 1 to 30 keV; and
   analyzing the ion beam to select a singly charged antimony dimer from the ion beam.

3. The method of claim 1, wherein the step of extracting the ion beam comprises extracting the ion beam at about 5 keV.

4. The method of claim 1, wherein the step in implanting the antimony dimer comprises the step of implanting the antimony dimer into the substrate to a depth of about 5 to 80 nanometers.

5. A method for forming a shallow junction in a semiconductor device comprising the steps of:
   providing a semiconductor substrate having a predefined implant region therein;
   implanting an antimony dimer into the predefined implant region to form a shallow doped region,
   wherein the shallow doped region has a junction depth of about 5 to 80 nanometers, and
   wherein the shallow doped region has a surface concentration of at least 1.0 E13 ions per square centimeter.

6. The method of claim 5 further comprising the step of annealing the semiconductor substrate by means selected from the group consisting of laser annealing and rapid thermal annealing to activate antimony implanted into the semiconductor substrate.

7. The method of claim 6, wherein the step of annealing comprises annealing in an inert atmosphere at a temperature of about 950 to 1300° C. for a time of about 1 nanosecond to 20 seconds.

8. The method of claim 5, wherein the step of implanting and antimony dimer comprises implanting a dose of about 1.0 E13 to 1.0 E15 ions per square centimeter.

9. A method for forming a shallow junction in a semiconductor device comprising the steps of:
   providing an antimony source material;
   creating antimony ions from the antimony source material;
   extracting a beam of antimony ions at an extraction voltage of about 1 to 30 KV to generate an antimony ion beam;
   analyzing the antimony ion beam to generate an antimony dimer ion beam;
   directing the antimony dimer ion beam at a semiconductor substrate; and
   forming a shallow doped antimony region in the semiconductor substrate,
   wherein the shallow doped region has a junction depth of about 5 to 80 nanometers.

10. The method of claim 9, wherein the step of forming a shallow doped region comprises implanting the antimony dimer to a dose of about 1.0 E13 to 1.0 E15 ions per square centimeter.

11. A method for forming a shallow junction in a semiconductor device comprising the steps of:
    providing a semiconductor substrate having a surface and forming a gate electrode structure thereon,
    wherein the gate electrode has a first and a second side;
    forming a source region in the substrate adjacent to the first side of the gate electrode, and forming a drain region in the substrate adjacent to the second side of the gate electrode;
    forming an antimony dimer ion beam; and
    implanting antimony dimer ions into the source and drain regions to form source/drain extension regions therein,
    wherein the source/drain extension regions reside within the source and drain regions near the surface of the substrate surface.

12. The method of claim 11, wherein the source/drain extension regions have a junction, and wherein the junction resides about 5 to 80 nanometers below the surface of the substrate.

13. The method of claim 11, wherein the step of implanting antimony dimer ions to form source/drain extension regions comprises ion implanting a dose of about 1.0 E13 to 1.0 E15 ions per square centimeter.

14. The method of claim 11, wherein the step of forming an antimony dimer ion beam comprises the steps of:
    extracting an incident ion beam from an ion source at an extraction energy of about 1 to 30 keV; and
    analyzing the incident ion beam to select a singly charged antimony dimer from the incident ion beam.

15. The method of claim 14, wherein the step of extracting an incident ion beam comprises extracting the incident ion beam at an energy of no more than 30 keV.

16. The method of claim 11 further comprising the step of annealing the semiconductor substrate by means selected from the group consisting of laser annealing and rapid thermal annealing to activate antimony implanted into the semiconductor substrate.

17. The method of claim 16 wherein the step of annealing comprises annealing in an inert atmosphere at a temperature of about 950 to 1300° C. for a time of about 1 nanosecond to 20 seconds.

18. The method of claim 17, wherein the step of annealing in an inert atmosphere comprises anneal in nitrogen.

19. The method of claim 11, wherein the step of forming an antimony dimer ion beam comprises the steps of:
    providing an ion implantation system having a source chamber containing a solid antimony source material; and
    extracting an incident ion beam from the source chamber,
    wherein the incident ion beam contains a finite amount of antimony dimer ions; and
    analyzing the incident ion beam to select the antimony dimer ions.

20. The method of claim 19, wherein the solid antimony source material comprises an antimony oxide material.

* * * * *